(12) United States Patent
Ikarashi et al.

(10) Patent No.: US 11,496,041 B2
(45) Date of Patent: Nov. 8, 2022

(54) GATE DRIVE DEVICE, GATE DRIVE METHOD, POWER SEMICONDUCTOR MODULE, AND ELECTRIC POWER CONVERSION DEVICE

(71) Applicant: Hitachi Power Semiconductor Device, Ltd., Hitachi (JP)

(72) Inventors: Daisuke Ikarashi, Tokyo (JP); Toru Masuda, Tokyo (JP); Seiichi Hayakawa, Hitachi (JP); Yuji Takayanagi, Hitachi (JP); Masamitsu Inaba, Hitachi (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 112 days.

(21) Appl. No.: 17/160,887

(22) Filed: Jan. 28, 2021

(65) Prior Publication Data
US 2021/0296979 A1    Sep. 23, 2021

(30) Foreign Application Priority Data

Mar. 18, 2020    (JP) .............................. JP2020-047254

(51) Int. Cl.
*H02M 1/084*    (2006.01)
*H02M 1/08*    (2006.01)

(52) U.S. Cl.
CPC ........... *H02M 1/083* (2013.01); *H02M 1/084* (2013.01)

(58) Field of Classification Search
CPC ........ H02M 1/08; H02M 1/082; H02M 1/083; H02M 1/084
See application file for complete search history.

(56) References Cited

U.S. PATENT DOCUMENTS

| | | | |
|---|---|---|---|
| 9,966,871 B2* | 5/2018 | Ishimaru | H02M 1/08 |
| 10,069,436 B2* | 9/2018 | Ishimaru | H02M 7/219 |
| 10,079,536 B2* | 9/2018 | Ishimaru | H02K 7/006 |
| 10,916,643 B2* | 2/2021 | Takeuchi | H03K 17/16 |
| 11,012,022 B2* | 5/2021 | Ishimaru | H02M 7/53871 |
| 2012/0068683 A1* | 3/2012 | Liu | H02M 1/08 323/311 |
| 2013/0088279 A1* | 4/2013 | Shimano | H03K 17/284 327/401 |
| 2013/0265029 A1* | 10/2013 | Akiyama | H03K 17/94 327/109 |
| 2016/0036433 A1* | 2/2016 | Toshiyuki | H02M 1/08 327/109 |

(Continued)

FOREIGN PATENT DOCUMENTS

JP    2015-126342 A    7/2015

*Primary Examiner* — Adolf D Berhane
(74) *Attorney, Agent, or Firm* — Crowell & Moring LLP

(57) ABSTRACT

The invention provides a gate drive device, a gate drive method, a power semiconductor module, and an electric power conversion device capable of reducing a negative gate surge voltage. The gate drive device drives a semiconductor device constituting an arm in an electric power conversion device. Before a turn-off start of a drive arm, in a counter arm, a voltage between one main terminal of the semiconductor device and a gate terminal of the semiconductor device is charged to a voltage value that is larger, in a positive direction, than a negative voltage of a negative gate power supply and smaller than a gate threshold voltage of the semiconductor device.

9 Claims, 9 Drawing Sheets

(56) References Cited

U.S. PATENT DOCUMENTS

2016/0164413 A1* 6/2016 Akiyama ............. H03K 17/165
                                                        323/271
2016/0308523 A1   10/2016 Otake et al.
2021/0234454 A1*  7/2021 Ishii ................. H03K 17/08122
2021/0288640 A1*  9/2021 Masuda ................. H02M 1/08

* cited by examiner

GATE DRIVE DEVICE, GATE DRIVE METHOD, POWER SEMICONDUCTOR MODULE, AND ELECTRIC POWER CONVERSION DEVICE

CLAIM OF PRIORITY

The present application claims priority from Japanese patent application JP 2020-047254 filed on Mar. 18, 2020, the content of which is hereby incorporated by reference into this application.

BACKGROUND OF THE INVENTION

1. Field of the Invention

The present invention relates to a gate drive device and a gate drive method that drive a semiconductor device, and a power semiconductor module and an electric power conversion device to which the gate drive device and the gate drive method are applied.

2. Description of the Related Art

An electric power conversion device has functions of AC-DC conversion and DC-AC conversion of electric power, or frequency conversion of AC power and voltage conversion of DC power. In order to implement such conversion functions, the electric power conversion device includes an electric power conversion circuit that converts electric power by a turn-on and a turn-off of a power semiconductor module having a switching function. The power semiconductor module is in an on state when a gate drive circuit controls a gate voltage between a gate terminal and a source terminal (or emitter terminal) to High (a positive voltage), and is in an off state when the gate drive circuit controls the gate voltage to Low (0 V or a negative voltage). Further, the gate drive circuit is controlled by a higher-level controller.

The power semiconductor module includes a 1in1 module in which a single or a plurality of parallel-connected semiconductor switching elements (hereinafter referred to as "switching elements") are mounted, and a 2in1 module in which two switching elements are series-connected inside the module to form a half-bridge circuit in one module.

Silicon (Si) elements have been used for the switching elements so far, but in order to improve performance of the electric power conversion circuit, in recent years, (SiC) silicon carbide elements having excellent low on-resistance, high-speed switching performance, high-temperature operability, and the like have been widespread.

A technique described in JP-A-2015-126342 (Patent Literature 1) is known as a technique in the related art for high-speed switching of a metal oxide semiconductor field effect transistor (SiC-MOSFET). In the technique in the related art, as a countermeasure against malfunction and parasitic oscillation during switching in the half-bridge circuit, an active mirror clamp circuit is mounted inside the power semiconductor module to reduce wiring impedance between a gate terminal and a source terminal of the SiC-MOSFET.

In the half-bridge circuit, when the switching element of a drive arm is turned off, a voltage across a switching element of a counter arm, which is a non-drive arm, decreases, and thereby a current flows in a discharge direction of the gate voltage through a feedback capacitance of the counter arm, so that a negative gate surge voltage is generated in the counter arm.

When such a negative gate surge voltage is excessive, the switching element may fail or characteristics thereof may deteriorate. In a case of the SiC-MOSFET, a negative gate rated voltage is about −4 V to −15 V, and is smaller than a gate rated voltage of a Si-MOSFET, about −20 V, so that a gate voltage of the counter arm tends to exceed the negative gate rated voltage, and the effect of the negative gate surge voltage is remarkable.

On the other hand, in the above-mentioned technique in the related art, the negative gate surge voltage is generated by the wiring impedance of the active mirror clamp circuit and the current flowing through the feedback capacitance, and when a switching speed is increased, the negative gate rated voltage may be exceeded.

SUMMARY OF THE INVENTION

Therefore, the invention provides a gate drive device, a gate drive method, a power semiconductor module, and an electric power conversion device capable of reducing the negative gate surge voltage.

In order to solve above problems, a gate drive device according to the invention drives a semiconductor device constituting an arm in an electric power conversion device. Before a turn-off start of a drive arm, in a counter arm, a voltage between one main terminal of the semiconductor device and a gate terminal of the semiconductor device is charged to a voltage value that is larger, in a positive direction, than a negative voltage of a negative gate power supply and smaller than a gate threshold voltage of the semiconductor device.

In order to solve above problems, a gate drive method according to the invention is a method for driving a semiconductor device constituting an arm in an electric power conversion device. Before a turn-off start of a drive arm, in a counter arm, a voltage between one main terminal of the semiconductor device and a gate terminal of the semiconductor device is charged to a voltage value that is larger, in a positive direction, than a voltage of a negative gate power supply and smaller than a gate threshold voltage of the semiconductor device.

In order to solve the above problems, a power semiconductor module according to the invention includes: an upper arm and a lower arm constituting a main circuit of an electric power conversion device; a first gate drive device configured to drive the upper arm; and a second gate drive device configured to drive the lower arm. The first and second gate drive devices are included in the gate drive device according to the invention.

In order to solve the above problems, an electric power conversion device according to the invention includes: a main circuit including a plurality of pairs of arms; a first gate drive device configured to drive an upper arm in the pair of arms; and a second gate drive device configured to drive a lower arm in the pair of arms. The first and second gate drive devices are included in the gate drive device according to the invention.

According to the invention, the negative gate surge voltage can be reduced.

Problems, configurations, and effects other than those described above will be further clarified with the following description of embodiments.

DESCRIPTION OF THE PREFERRED EMBODIMENTS

Figure 1:
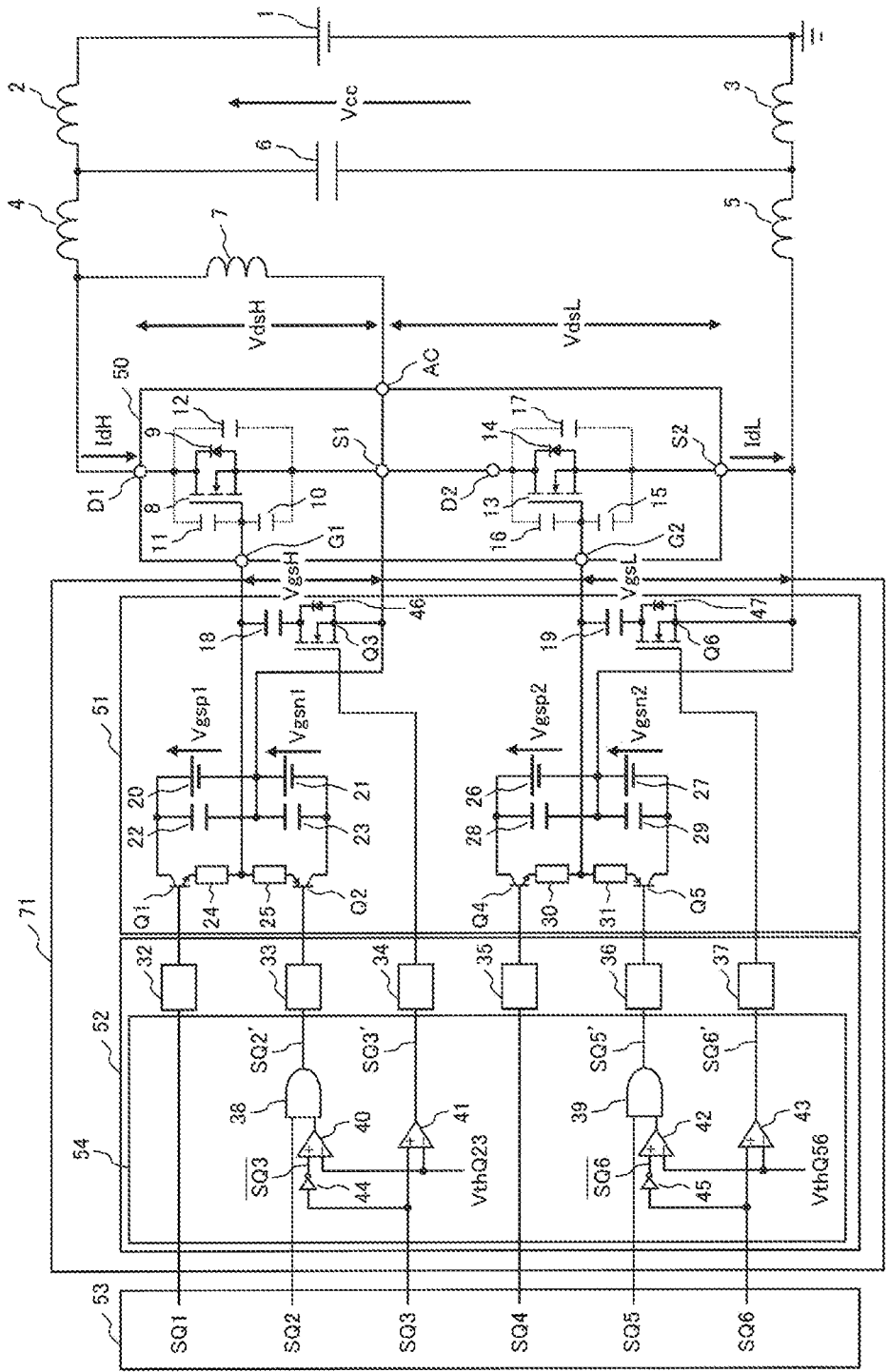
FIG. 1 is a circuit diagram showing a configuration of a gate drive device according to a first embodiment.

Hereinafter, as for embodiments of the invention, a first embodiment to a fourth embodiment will be described with reference to the drawings. In the drawings, the same reference numerals denote same constituent elements or constituent elements having similar functions.

First Embodiment

Hereinafter, the first embodiment of the invention will be described with reference to FIGS. 1 to 3. Firstly, a configuration of the first embodiment will be described with reference to FIG. 1, and then operations in the first embodiment will be described with reference to FIGS. 2 and 3.

FIG. 1 is a circuit diagram showing a configuration of a gate drive device according to the first embodiment of the invention.

As shown in FIG. 1, in the first embodiment, a gate-driven semiconductor device is a so-called 2in1 module 50. In this 2in1 module 50, an upper arm formed of a parallel-connected body including a switching element 8 and a diode 9, and a lower arm formed of a parallel-connected body including a switching element 13 and a diode 14 are series-connected with each other to form a half-bridge circuit. The present embodiment can also be applied to a case where separate 1in1 modules are used as the upper arm and the lower arm.

As the switching elements 8, 13, in addition to a MOSFET shown in the drawings, an insulated gate bipolar transistor (IGBT) and the like are applied. As the diodes 9, 14, in addition to a pn junction diode, schottky barrier diodes (SBD) and the like are applied. Semiconductor materials constituting the switching elements 8, 13 and the diodes 9, 14 may be Si or a wide-gap semiconductor such as SiC. When the MOSFET is applied as the switching elements 8, 13, a parasitic diode (body diode) of the MOSFET may be used as the diodes 9, 14.

The switching elements 8, 13 are respectively provided with drain terminals D1, D2, gate terminals G1, G2, and source terminals S1, S2, and parasitic capacitances, i.e., feedback capacitances 11, 16, drain-source terminal capacitances 12, 17, and gate-source terminal capacitances 10, 15 exist between corresponding terminals. The drain terminal D1 is a high potential terminal, an output terminal AC which is a connection point between the source terminal S1 and the drain terminal D2 is an intermediate potential terminal, and the source terminal S2 is a low potential terminal. The connection point between the source terminal S1 and the drain terminal D2 is also a series-connected point of the switching elements 8, 13.

These terminals (D1, S1, S2, AC, G1, G2) are connected to external circuits (main circuit, gate drive device). In the 2in1 module 50, the half-bridge circuit is housed in a case (resin case, and the like) that is not shown, but the terminals (D1, S1, S2, AC, G1, G2) are pulled out of the case, so as to be capable of being connected to the external circuits. Further, the source terminal S2 may be divided into a main terminal to which the main circuit is connected and an auxiliary terminal to which the gate drive device is connected.

FIG. 1 shows a lower arm driven half-bridge circuit configuration in which an inductive load 7 is connected between the drain terminal D1 and the output terminal AC. Further, the drain terminal D1 and the source terminal S2 are connected to a smoothing capacitor 6 via wirings 4, 5, and the smoothing capacitor 6 is connected to a DC power supply 1 via wirings 2, 3. The smoothing capacitor 6 is charged to a DC power supply voltage Vcc by the DC power supply 1. Such a main circuit configuration corresponds to, for example, one phase of a three-phase inverter that drives a three-phase AC motor. In this case, the inductive load 7 corresponds to one phase of a three-phase winding of the three-phase AC motor.

The gate terminals G1, G2 and the source terminals S1, S2 are connected to a gate drive circuit 51. With the gate drive circuit 51, a gate voltage VgsH of the upper arm is charged to a positive power supply voltage Vgsp1 of the gate drive circuit 51 to turn on the upper arm, and is charged to a negative power supply voltage Vgsn1 of the gate drive circuit 51 to turn off the upper arm. Similarly, a gate voltage VgsL of the lower arm is charged to a positive power supply voltage Vgsp2 of the gate drive circuit 51 to turn on the lower arm, and is charged to a negative power supply voltage Vgsn2 of the gate drive circuit 51 to turn off the lower arm.

The gate drive circuit 51 includes DC power supplies 20, 26 which are positive voltage power supplies, and DC power supplies 21, 27 which are negative voltage power supplies, in which smoothing capacitors 22, 28 for the positive voltage power supply are respectively charged to the positive power supply voltages Vgsp1, Vgsp2, and smoothing capacitors 23, 29 for the negative voltage power supply are respectively charged to the negative power supply voltages Vgsn1, Vgsn2.

In the gate drive circuit 51, a switching element Q1 is turned on when the upper arm is turned on, so that the gate voltage VgsH of the upper arm is charged to the positive power supply voltage Vgsp1 via a gate resistor 24. A switching element Q4 is turned on when the lower arm is turned on, so that the gate voltage VgsL of the lower arm is charged to the positive power supply voltage Vgsp2 via a gate resistor 30. A switching element Q2 is turned on when the upper arm is turned off, so that the gate voltage VgsH of the upper arm is charged to the negative power supply voltage −Vgsn1 via a gate resistor 25. A switching element Q5 is turned on when the lower arm is turned off, so that the gate voltage VgsL of the lower arm is charged to the negative power supply voltage −Vgsn2 via a gate resistor 31.

In the first embodiment, as shown in FIG. 1, a junction bipolar transistor is applied as the switching elements Q1, Q2, Q4, Q5, but the invention is not limited to this, and the MOSFET or the like may be applied.

In the gate drive circuit 51, a series-connected circuit including a capacitor 18 and a switching element Q3 and a series-connected circuit including a capacitor 19 and a switching element Q6 are mirror clamp circuits, and impedance between the gate terminal and the source terminal when an own arm is in an off state is reduced. As a result, fluctuations (rise) of the gate voltages VgsH, VgsL respectively due to the feedback capacitances 11, 16 are prevented.

For example, when switching to the lower arm, which is a drive arm, the switching element Q3 of the mirror clamp circuit on an upper arm side, which is a counter arm and in an off state, is turned on, so that impedance between the gate terminal G1 and the source terminal S1 on the upper arm is reduced. As a result, the fluctuation of the gate voltage VgsH of the upper arm is prevented. At this time, the switching element Q6 of the mirror clamp circuit on a drive arm side is in an off state. When the upper arm is a drive arm, the switching element Q3 is turned off, and the switching element Q6 is turned on, so that the fluctuation of the gate voltage VgsL of the lower arm, which is a counter arm, is prevented.

The switching elements Q1 to Q6 in the gate drive circuit 51 are controlled by an on/off control signal from a control circuit 52. Based on a pulse width modulation (PWM) signal 53 (SQ1 to SQ6) received from a controller (not shown) of an electric power conversion device, the control circuit 52 generates the on/off control signal for the switching elements Q1 to Q6 and outputs the on/off control signal to the gate drive circuit 51.

The signal SQ2 for off control of the upper arm is a signal obtained by inverting the signal SQ1 for on control of the upper arm. That is, when the signal SQ1 is High, the signal SQ2 is Low, and when the signal SQ1 is Low, the signal SQ2 is High. Similarly, the signal SQ5 for off control of the lower arm is a signal obtained by inverting the signal SQ4 for on control of the lower arm.

A rise (change from Low to High) of the signal SQ3 for controlling an upper arm mirror clamp circuit is synchronized with a rise of the signal SQ4 for the on control of the lower arm. On the other hand, a fall (change from High to Low) of the SQ3 is delayed for a certain period of time as compared with a fall of the SQ4. When the upper arm is a drive arm, a rise of the signal SQ6 for controlling a lower arm mirror clamp circuit is synchronized with a rise of the signal SQ1 for the on control of the upper arm, and a fall of the SQ6 is delayed for a certain period of time as compared with a fall of the SQ1.

Here, the delay time at the falls of SQ3 and SQ6 is set to be equal to or longer than a turn-off switching time of the switching elements 8, 13. The setting of the delay time in this way is to continue an operation of the mirror clamp circuit even during a turn-off period of the switching elements 8, 13.

Next, a precharge control unit 54 provided for preventing a negative gate surge voltage in the first embodiment will be described with reference to FIGS. 1 to 3.

As shown in FIG. 1, in the control circuit 52, the signals SQ1 to SQ6 are firstly input to the precharge control unit 54. Since a signal processing function of the precharge control unit 54 is the same for the upper and lower arms, the signal processing function of the precharge control unit 54 will be described here by taking the upper arm as an example.

The precharge control unit 54 does not perform any processing on the SQ1, and the SQ1 is input to an amplifier 32 without any change.

The SQ2 is input to an AND circuit 38. The SQ3 is input to a NOT circuit 44 and a comparator 41. An output of the NOT circuit 44 is input to a comparator 40. The comparator 40 outputs a High signal to the AND circuit 38 when the output of the NOT circuit 44 is larger than a threshold voltage VthQ23, and outputs a Low signal to the AND circuit 38 when the output of the NOT circuit 44 is smaller than the threshold voltage VthQ23. The AND circuit 38 outputs, to an amplifier 33, an output signal SQ2' as a High signal in a case where both the SQ2 and an output of the comparator 40 are High signals, and outputs, to the amplifier 33, the output signal SQ2' as a Low signal in other cases.

The comparator 41 outputs, to an amplifier 34, an output signal SQ3' as a High signal when the SQ3 is larger than the threshold voltage VthQ23, and outputs, to the amplifier 34, the output signal SQ3' as a Low signal when the SQ3 is smaller than the threshold voltage VthQ23.

The amplifiers 32, 33, 34 respectively amplify the SQ1, SQ2', SQ3', which are input from the precharge control unit 54, to a size with which the switching elements Q1, Q2, Q3 can be driven, and output the amplified SQ1, SQ2', SQ3'. The switching elements Q1, Q2, Q3 are turned on and off according to the outputs of the amplifiers 32, 33, 34.

Figure 2:
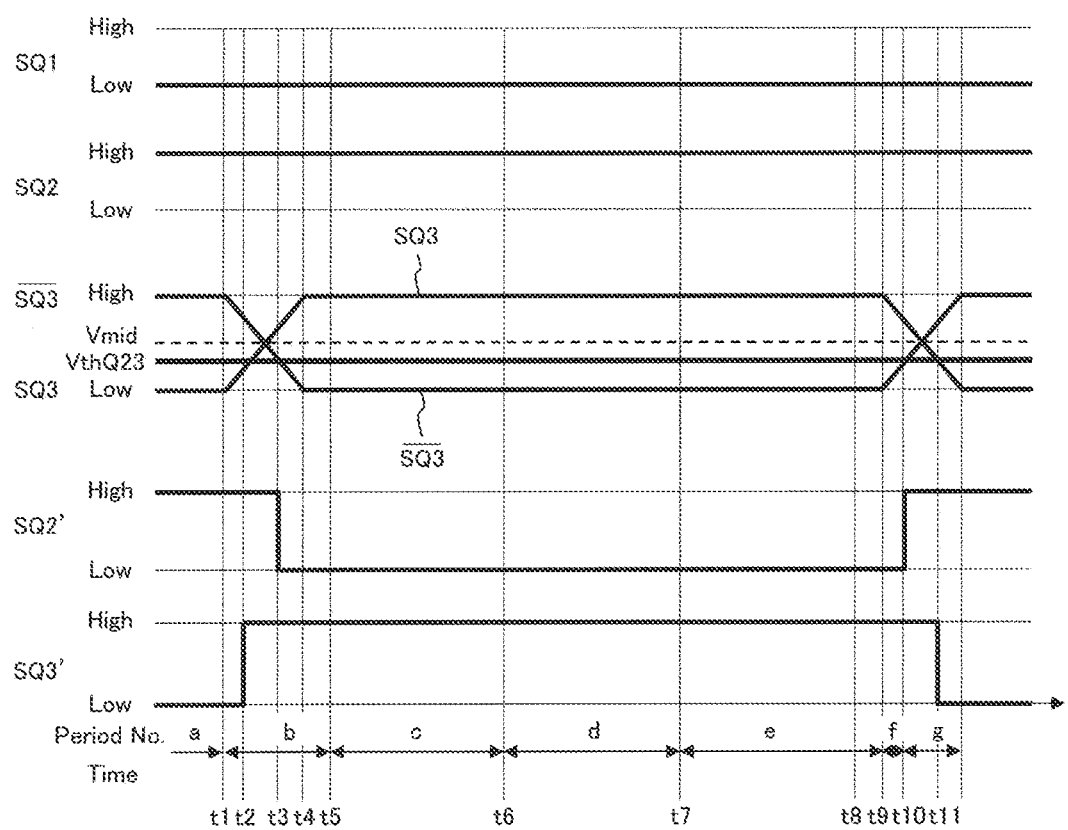
FIG. 2 is a time chart showing a signal processing operation of a precharge control unit in FIG. 1.

FIG. 2 is a time chart showing a signal processing operation of the precharge control unit 54 in FIG. 1. The switching elements Q1, Q2, Q3 are respectively controlled to be in an on state or an off state by using the signals SQ1, SQ2', SQ3', and the switching element is controlled to be on and off depending on whether the corresponding signal is High or Low.

Since the lower arm is a drive arm, the precharge control unit 54 functions as means for reducing the negative gate surge voltage in the upper arm in which the switching element 8 is in an off state. Therefore, FIG. 2 shows the signal processing operation of the precharge control unit 54 for the SQ1 to SQ3 for upper arm control when the lower arm is set as a drive arm (off→turn on→turn off), the upper arm is set as a counter arm (in an off state), and the SQ2 is High (switching element 8 is off).

The SQ1 is a PWM signal for an on-gate circuit unit including the switching element Q1 (FIG. 1), and the SQ2 is a PWM signal for an off-gate circuit unit including the switching element Q2 (FIG. 1). Therefore, High and Low of the SQ1 and the SQ2 are in a complementary relationship. Therefore, as shown in FIG. 2, since the SQ2 is constant at High, the SQ1 is constant at Low.

When the rise of the SQ3 starts at a time t1 and the SQ3 is larger than VthQ23 at a time t2, an output SQ3' of the comparator 41 (FIG. 1) is High.

When the output (inverted signal of SQ3) of the NOT circuit 44 (FIG. 1) is smaller than VthQ23 at a time t3, since the output (not shown) of the comparator 40 is Low, the output SQ2' of the AND circuit 38 (FIG. 1) to which the SQ2 and the output of the comparator 40 are input is Low.

As described above, the rise of the SQ3 is synchronized with the rise of the SQ4, so that at the time t1, the lower arm, which is the drive arm, starts a turn-on. At this time, since the SQ3' is High at the time t2, the Q3 is turned on and the upper arm mirror clamp circuit operates. After that, at the time t3, the SQ2' is Low, so that the Q2 is turned off. As a result, in a state where the upper arm mirror clamp circuit is operating, the off-gate circuit including the Q2 and used for the upper arm is once electrically separated from the switching element 8 of the upper arm.

After that, the drive arm completes the turn-on at a time t6 (see FIG. 3 below).

After that, the drive arm starts a turn-off at a time t7 (see FIG. 3 below).

When the fall of the SQ3 starts at a time t9 and the inverted signal of the SQ3 is larger than VthQ23 at a time t10, since the output (not shown) of the comparator 40 is High, the output SQ2' of the AND circuit is High.

When the SQ3 is smaller than VthQ23 at a time t11, the output SQ3' of the comparator 41 (FIG. 1) is Low.

As described above, the fall of the SQ3 is delayed for the certain period of time as compared with the fall of the SQ4, so that the lower arm, which is the drive arm, starts the turn-off at the time t7 and completes the turn-off at the time t10 (see FIG. 3 below). At the time t10 after the turn-off of the drive arm is completed, the SQ2' is High, so that the Q2 is turned on. As a result, the off-gate circuit including the Q2 and used for the upper arm, which has been electrically separated from the switching element 8 after the time t2, is connected to the switching element 8 again and operates. At the time t11, since the SQ3' is Low, the Q3 is turned off and the upper arm mirror clamp circuit is electrically separated from the switching element 8 of the upper arm and is in a non-operating state.

In this way, the lower arm completes the turn-off while the upper arm mirror clamp circuit is operating, and at this time, the off-gate circuit for the upper arm operates again and then the upper arm mirror clamp circuit ends the operation.

When the lower arm starts the turn-on at the time t1, the gate voltage VgsH of the upper arm rises due to a dv/dt current flowing via the feedback capacitance 11 of the switching element 8 of the upper arm, but by operating the upper arm mirror clamp circuit at the time t2, such a rise in the gate voltage is prevented. Further, at the time t3, when the upper arm mirror clamp circuit is operating, the off-gate circuit for the upper arm is in a non-operating state. Therefore, as will be described later (see FIG. 3), the gate voltage VgsH is not charged to a negative power supply voltage (−Vgsn1), but charged within a range of −Vgsn1<Vgs<0. Then, the lower arm is turned off in such a VgsH charging state, so that the negative gate surge voltage generated in the upper arm at this time can be prevented.

Here, by setting VthQ23 to an intermediate level between High and Low of the SQ3, that is, a value smaller than a median value Vmid between High and Low, when the SQ3 rises, the SQ3' is set to High and then the SQ2' is set to Low, and when the SQ3 falls, the SQ2' is set to High and then the SQ3' is set to Low.

Such timings of the SQ2' and the SQ3' may be set by using a comparator as in the present embodiment, or may be set by a signal delay. In this case, for example, when the SQ3 rises, a delay time is provided for a fall of the SQ2' with respect to the rise of the SQ3', and when the SQ3 falls, a delay time is provided for a fall of the SQ3' with respect to the rise of the SQ2'.

Figure 3:
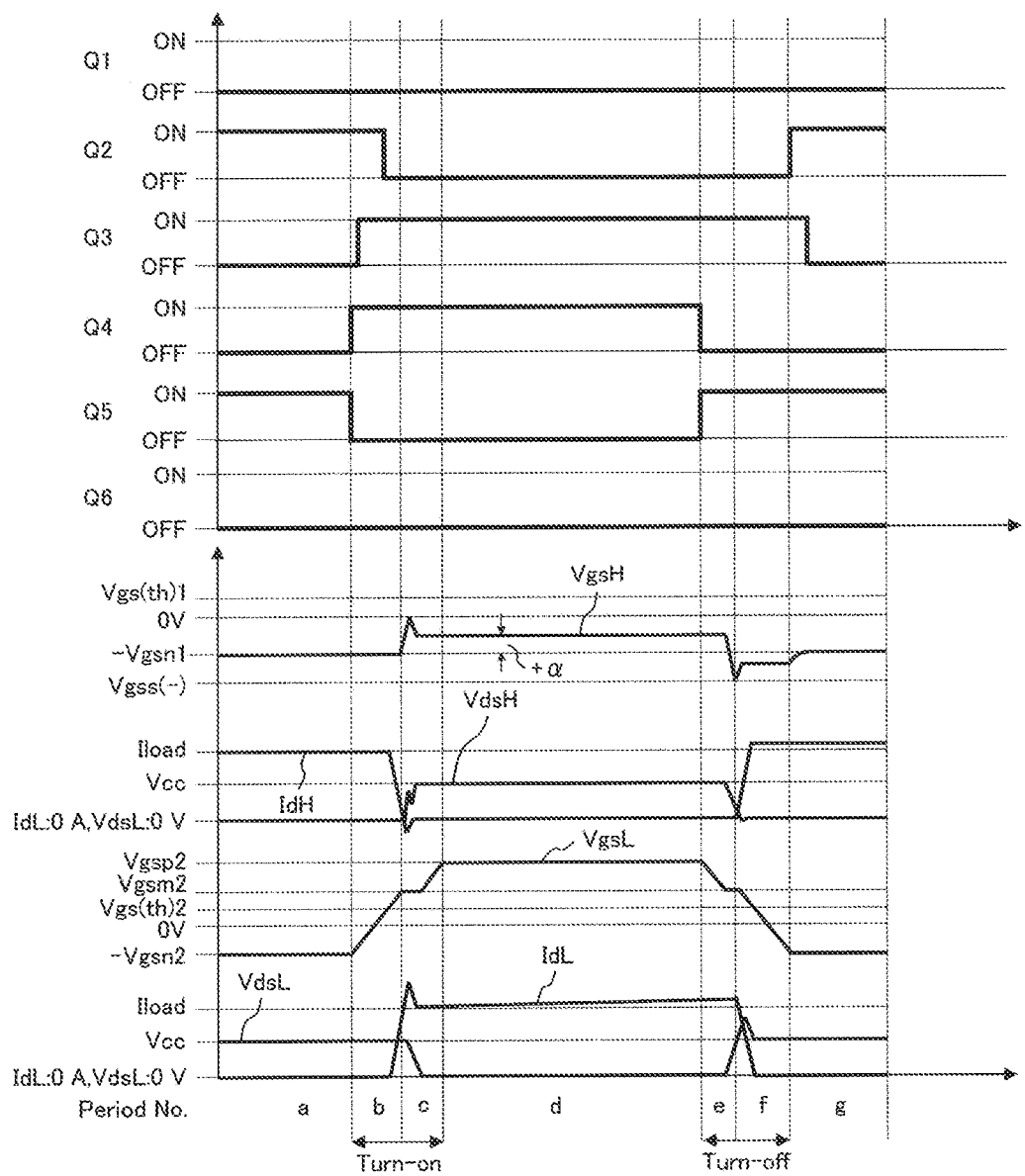
FIG. 3 is a time chart showing an operating state of a gate drive circuit and upper and lower arms in FIG. 1.

FIG. 3 is a time chart showing an operating state of the gate drive circuit and the upper and lower arms in FIG. 1.

FIG. 3 shows, from a top, on and off operating states of the switching elements Q1 to Q6 in the gate drive circuit 51 (FIG. 1), the gate voltage (gate-source voltage) VgsH of the upper arm, a drain voltage (drain-source voltage) VdsH and a drain current IdH of the upper arm, the gate voltage (gate-source voltage) VgsL of the lower arm, and a drain voltage (drain-source voltage) VdsL and a drain current IdL of the lower arm. The IdH in FIG. 3 is a current flowing through the diode 9, and a forward current of the diode 9 is taken as positive.

Periods a, b, c, d, e, f and g shown in FIG. 3 respectively correspond to periods (before t1), (t1 to t5), (t5 to t6), (t6 to t7), (t7 to t9), (t9 to t10), and (t10 to t11 and later) shown in FIG. 2.

In the period a, the Q1 is in an off state and the Q2 is in an on state. Therefore, the VgsH is charged to the negative power supply voltage (−Vgsn1) of the upper arm of the gate drive circuit, and the switching element 8 of the upper arm is in an off state. In addition, the Q3 is in an off state, and the upper arm mirror clamp circuit is in a non-operating state.

Before the period a, due to energy accumulated in the inductive load 7 when the switching element 13 of the lower arm is turned on (not shown), a load current Iload, as the IdH, returns from the inductive load 7 via the diode 9 of the upper arm. At this time, the VdsH is a forward voltage of the diode 9 of the upper arm (<<DC power supply voltage Vcc (FIG. 1)). Further, a voltage (not shown) of the capacitor 18 of the upper arm mirror clamp circuit is charged to the negative power supply voltage (−Vgsn1) of the upper arm of the gate drive circuit via a diode 46.

In the period a, the Q4 is in an off state and the Q5 is in an on state. Therefore, the VgsL is charged to a negative power supply voltage (−Vgsn2) of the lower arm of the gate drive circuit, and the switching element 13 of the upper arm is in an off state. Therefore, the IdL is 0 A, and the VdsL is the DC power supply voltage Vcc. In addition, the Q6 is in an off state, and the lower arm mirror clamp circuit is in a non-operating state. The lower arm is the drive arm, and the lower arm mirror clamp circuit is also in a non-operating state during the periods b to g described later.

A voltage (not shown) of the capacitor 19 of the lower arm mirror clamp circuit is charged to, same as the upper arm, the negative power supply voltage (−Vgsn2) of the lower arm of the gate drive circuit via a diode 47.

In the period b, the Q4 switches from an off state to an on state, and the Q5 switches from the on state to the off state. Therefore, the positive power supply voltage (Vgsp2) of the gate drive circuit is applied between the gate terminal G2 and the source terminal S2 of the lower arm, and charging of the VgsL is started. When the VgsL exceeds a threshold voltage Vgs(th)2 of the switching element 13, the switching element 13 of the lower arm is turned on, the Iload starts to be commutated from the diode 9 in the upper arm to the switching element 13 in the lower arm, and the IdL increases. Then, when the VgsL reaches a mirror voltage Vgsm2 of the switching element 13, the entire Iload is commutated from the diode 9 to the switching element 13, and the IdL is equal to the Iload.

In the period b, the Q3 is delayed as compared with the Q4 and switches from an off state to an on state. Therefore, the upper arm mirror clamp circuit operates, and the impedance between the gate terminal G1 and the source terminal S1 of the upper arm is reduced. Further, after a period from a time at which the Q3 switches from an off state to an on state, the Q2 switches from an on state to an off state. As a result, the application of the negative power supply voltage (−Vgsn1) between the gate terminal G1 and the source terminal S1 of the switching element 8 of the upper arm is stopped from the gate drive circuit, but the gate-source terminal capacitance 10 of the switching element 8 and the capacitor 18 are charged to −Vgsn1 in the period a, so that the VgsH is also maintained at −Vgsn1 in the period b.

In the period b, by delaying a timing of switching the Q2 from an on state to an off state than a timing of switching the Q3 from an off state to an on state, in a state where the impedance between the gate terminal G1 and the source terminal S1 of the upper arm is reduced by the mirror clamp circuit, an electrical connection between the gate terminal G1 of the upper arm and the upper arm gate drive circuit can be disconnected.

In the period c, the gate drive circuit discharges the feedback capacitance 16 of the switching element 13 of the lower arm, so that the VdsL decreases to near 0 V. Accordingly, the VdsH increases from near 0 V to Vcc. Due to a positive voltage change (dv/dt) of the VdsH at this time, a current for charging the voltage of the gate-source terminal capacitance 10 and the capacitor 18 flows through the feedback capacitance 11 of the switching element 8 of the upper arm. Due to this charging current and a voltage drop caused by the impedance between the gate terminal G1 and the source terminal S1 of the upper arm, the VgsH increases from −Vgsn1 in a positive voltage direction. At this time, since the impedance between G1-S1 is reduced by the mirror clamp circuit including the capacitor 18, the increase of the VgsH is prevented. Further, since the Q2 is in an off state and the gate drive circuit is electrically disconnected, the VgsH is not charged to the negative power supply voltage (−Vgsn1). Therefore, together with the prevention of the increase of the VgsH by the mirror clamp circuit, the VgsH is charged to −Vgsn1+α, which is increased in the positive voltage direction from −Vgsn1, as shown in FIG. 3. Here, −Vgsn1<−Vgsn1+α<0.

Magnitude of a depends on a circuit constant in a path of the charging current flowing through the feedback capacitance 11 and the voltage change (dv/dt) of the VdsH. Here, the VdsH changes in the positive direction according to a voltage change of the VdsL in a negative direction when the lower arm is turned on. Therefore, the magnitude of a depends on the circuit constant in the path of the charging current flowing through the feedback capacitance 11 and switching conditions of the upper and lower arms.

Here, as shown in FIG. 3, the VdsH vibrates due to sympathetic vibration caused by the parasitic capacitance of the switching element 8 and wiring inductance of the wirings 4, 5. Therefore, the VgsH also vibrates and increases or decreases, but the increase amount is larger than the decrease amount, and the VgsH converges to and is maintained at −Vgsn1+α.

In this way, in the period c, the gate voltage VgsH of the upper arm, which is the counter arm of the lower arm, which is the drive arm, is precharged by +a from −Vgsn1.

In the period c, when the switching element 13 of the lower arm is in an on state, and the switching element 8 of the upper arm erroneously ignites to be in an on state due to the increase of the VgsH, a short circuit occurs between the upper and lower arms, and an excessive current flows through the upper and lower arms. In contrast, in the present embodiment, since the increase of the VgsH is prevented by the mirror clamp circuit including the capacitor 18 as described above, the VgsH is lower than a gate threshold voltage Vgs(th)1 of the switching element 8 of the upper arm. Therefore, the erroneous ignition of the switching element 8 is prevented.

As shown in FIG. 3, in the present embodiment, the VgsH is charged to −Vgsn1+α, which is increased in the positive voltage direction from −Vgsn1. Here, −Vgsn1<−Vgsn1+α<0, but in order to prevent the erroneous ignition, −Vgsn1<−Vgsn1+α<Vgs(th)1 may be used. By setting −Vgsn1<−Vgsn1+α<0, reliability is high and the erroneous ignition is prevented.

The period d is a period during which the lower arm is on, and in the period d, by applying the power supply voltage Vcc of the DC power supply 1 to the inductive load 7 having an inductance value Lload, the IdL increases with a slope Vcc/Lload.

In the period e, the Q4 switches from an on state to an off state, and the Q5 switches from an off state to an on state. As a result, the negative power supply voltage −Vgsn2 of the gate drive circuit is applied between the gate terminal G2 and the source terminal S2 of the switching element 13 of the lower arm, so that the VgsL starts discharging. When the VgsL decreases and reaches the mirror voltage Vgsm2, the feedback capacitance 16 of the switching element 13 is charged by the gate drive circuit of the lower arm, so that the VdsL increases from 0 V to Vcc. Accordingly, the VdsH decreases from Vcc to 0 V.

Due to a negative voltage change (dv/dt) of the VdsH at this time, a current for discharging the voltage of the gate-source terminal capacitance 10 and the capacitor 18 flows through the feedback capacitance 11 of the switching element 8. Due to this discharging current and the voltage drop caused by the impedance between the gate terminal G1 and the source terminal S1 of the upper arm, a negative surge voltage that decreases in the negative voltage direction from −Vgsn1+a is generated in the VgsH.

In the period e, the Q3 does not switch from an on state to an off state, but continues in an on state until the end of the period f in which the turn-off of the switching element 13 is completed. As a result, in the period e, the impedance between G1-S1 is reduced by the upper arm mirror clamp circuit provided with the capacitor 18, so that the increase of the VgsH in the negative direction is prevented. Further, by making a timing of switching the Q2 from an off state to an on state in the period g earlier than a timing of switching the Q3 from an on state to an off state in the period g, before the Q3 is turned off, the gate drive circuit of the upper arm is electrically connected between the gate terminal G1 and the source terminal S1 of the switching element 8 and the negative gate power supply voltage (−Vgsn1) is applied therebetween.

In the period e, the negative surge voltage is generated from the state where the VgsH is precharged in the positive voltage direction by +α from −Vgsn1, so that a peak value of the negative surge voltage can be reduced by +α. Further, as described above, the mirror clamp circuit including the capacitor 18 prevents the increase of the VgsH in the negative direction. Therefore, the negative surge voltage of the VgsH can be reduced. As a result, the VgsH is prevented from exceeding a negative gate rated voltage Vgss (−) of the switching element 8 of the upper arm, and the reliability of the switching element 8 is prevented from being lowered.

In the period g, the Q3 is turned off, and then an operating state in the present embodiment returns to an operating state same as that of the period a described above.

Figure 4:
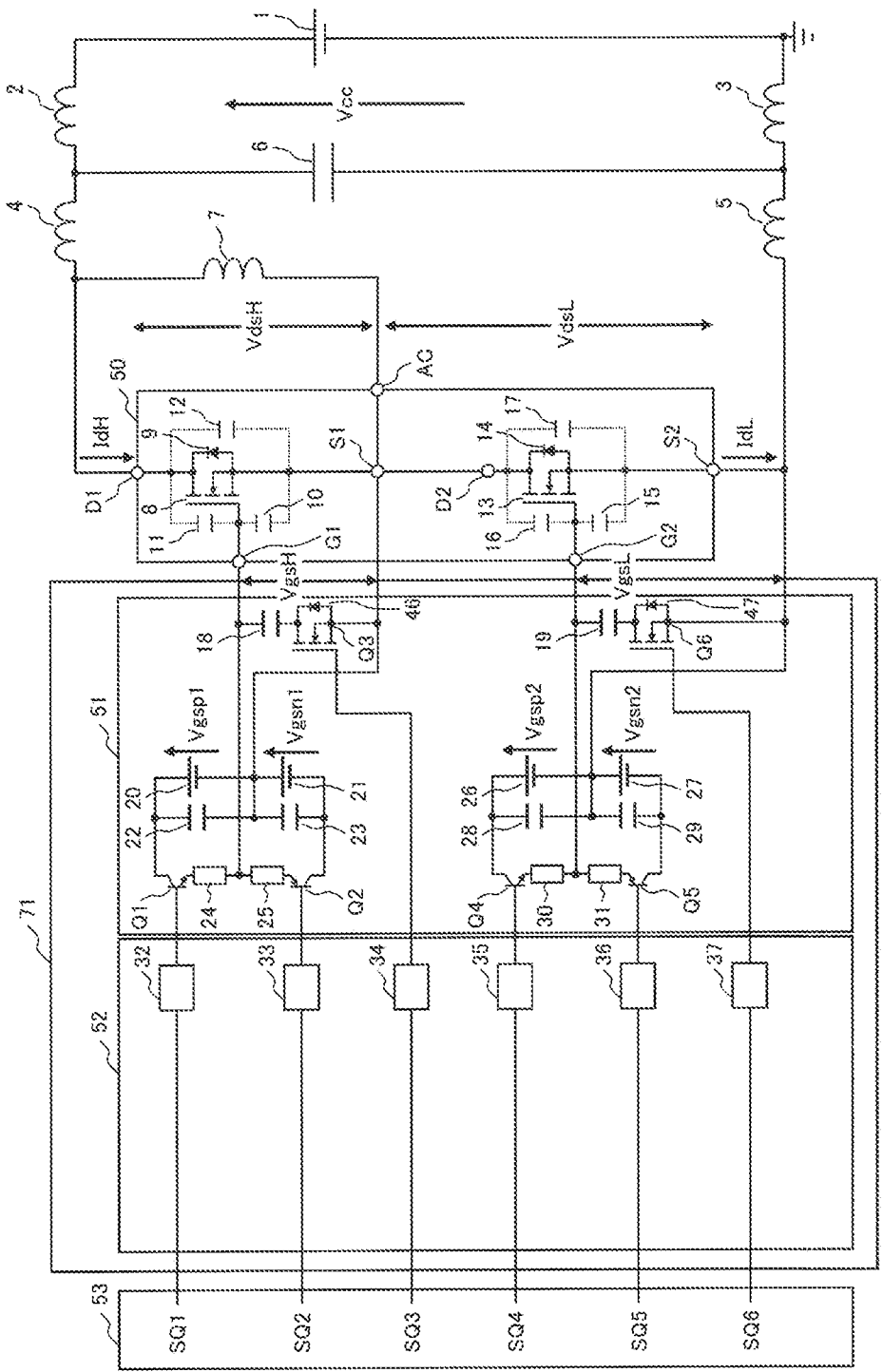
FIG. 4 is a circuit diagram showing a configuration of a gate drive device according to a comparative example.

FIG. 4 is a circuit diagram showing a configuration of a gate drive device according to a comparative example with respect to the first embodiment described above.

As shown in FIG. 4, in the present comparative example, the precharge control unit 54 shown in FIG. 1 is not included. Therefore, the PWM signals SQ1 to SQ6 from the controller (not shown) of the electric power conversion device are directly input to the amplifiers 32 to 37.

Figure 5:
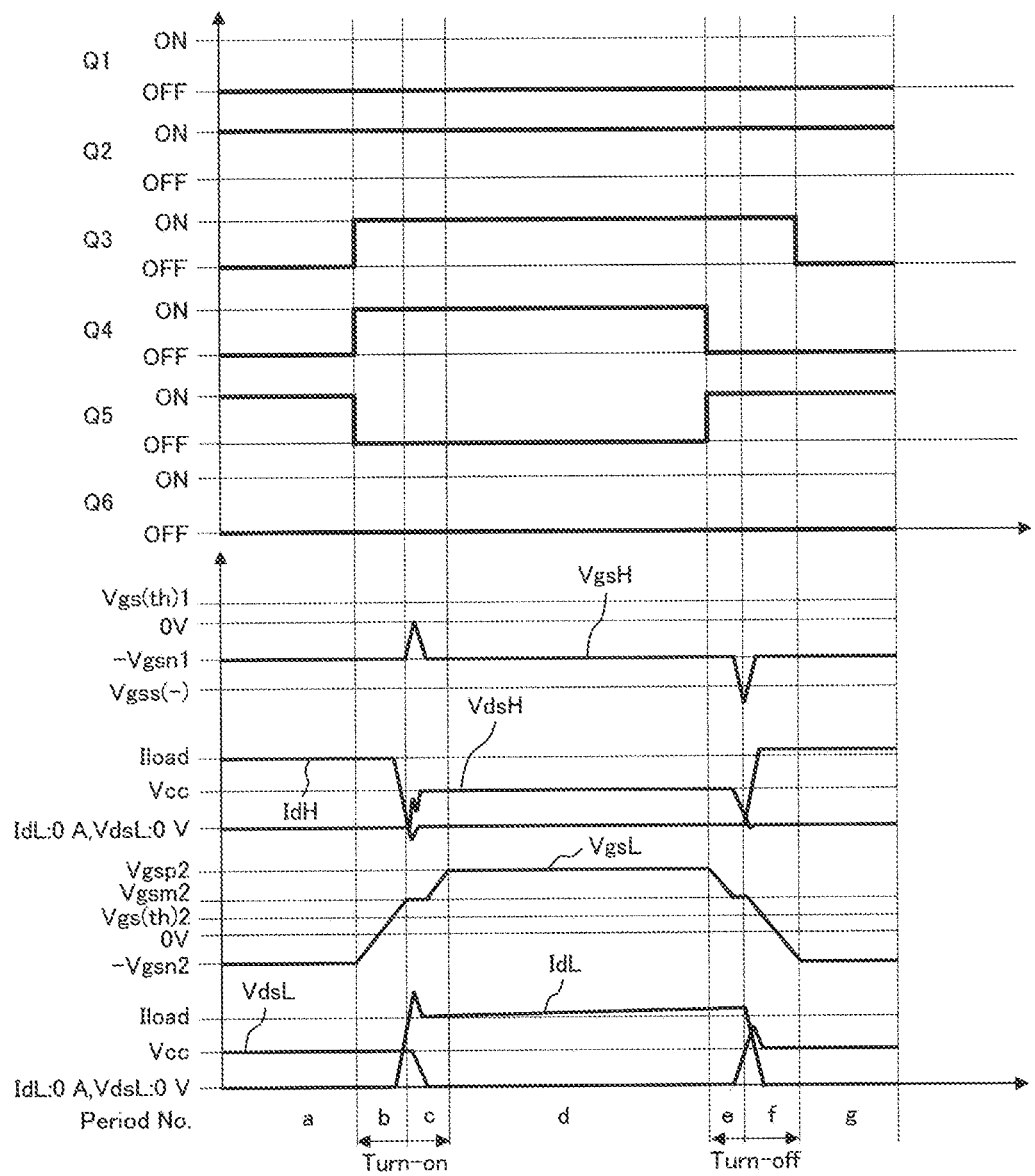
FIG. 5 is a time chart showing an operating state of a gate drive circuit and upper and lower arms according to the comparative example in FIG. 4.

FIG. 5 is a time chart showing an operating state of a gate drive circuit and upper and lower arms according to the comparative example in FIG. 4.

Same as FIG. 3, FIG. 4 shows, from a top, on and off operating states of the switching elements Q1 to Q6 in the gate drive circuit 51 (FIG. 4), the gate voltage (gate-source voltage) VgsH of the upper arm, a drain voltage (drain-source voltage) VdsH and a drain current IdH of the upper arm, the gate voltage (gate-source voltage) VgsL of the lower arm, and a drain voltage (drain-source voltage) VdsL and a drain current IdL of the lower arm. The IdH in FIG. 4 is a current flowing through the diode 9, and a forward current of the diode 9 is taken as positive.

As shown in FIG. 5, in the comparative example, unlike the embodiment described above (FIG. 3), the Q2 is not switched from an on state to an off state in the period b, and the Q2 is in an on state during the periods a to g.

When Q2 is kept in an on state, in the period c, the VgsH temporarily increases due to the surge voltage in the positive voltage direction that is caused by the positive voltage change (dv/dt) of the VdsH, and is then discharged to the negative power supply voltage −Vgsn1 of the gate drive circuit. Therefore, a peak of the surge voltage in the negative voltage direction caused by the negative voltage change (dv/dt) of the VdsH in the period e is larger by +a than that in the present embodiment (FIG. 3), and the VgsH may exceed the negative gate rated voltage Vgss (−).

For example, in a SiC-MOSFET, Vgss (−) is about −4 V to −15 V and is smaller in the negative voltage direction than a gate voltage of a Si-MOSFET, about −20V, so that a gate voltage of the counter arm tends to exceed the negative gate rated voltage due to the negative gate surge voltage.

As described above, according to the present embodiment, during a period from a turn-on start to a turn-on completion of a drive arm (lower arm), the mirror clamp circuit including a capacitor operates in a counter arm (upper arm) and the gate negative power supply is electrically disconnected from the counter arm, so that the gate voltage (VgsH) of the counter arm (upper arm) is precharged in the positive direction (+α) from the negative gate power supply voltage (−Vgsn1). As a result, when the drive arm (lower arm) in an on state is turned off, the negative gate surge voltage generated in the gate voltage (VgsH) of the counter arm (upper arm) can be prevented.

Further, in the case of increasing a switching speed of the switching element of the upper and lower arms, for example, in the case of applying the SiC-MOSFET, the increase in the negative gate surge voltage can be prevented.

Second Embodiment

Next, the second embodiment of the invention will be described with reference to FIGS. 6 and 7. Differences from the first embodiment will be mainly described.

Figure 6:
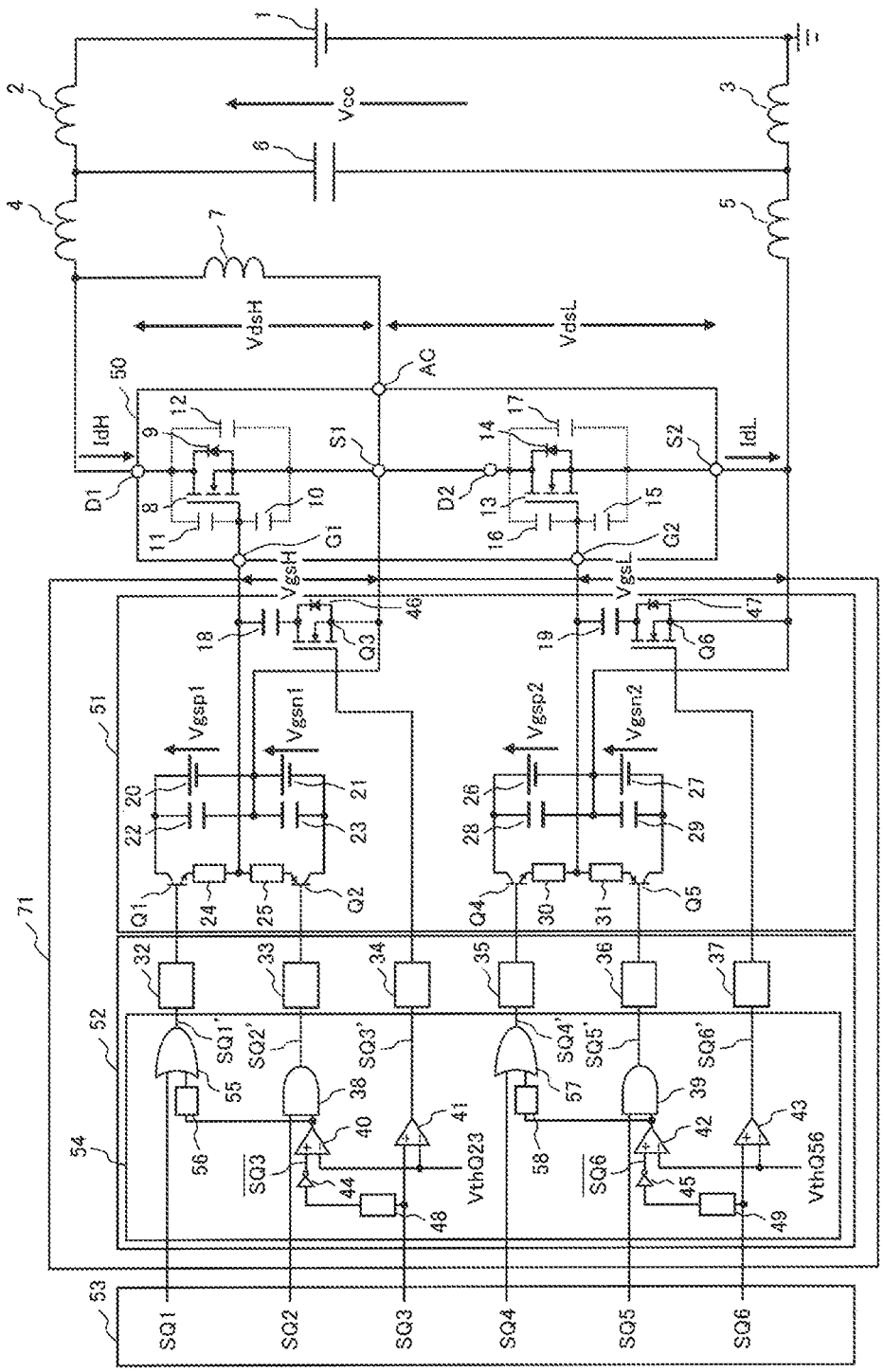
FIG. 6 is a circuit diagram showing a configuration of a gate drive device according to a second embodiment.

FIG. 6 is a circuit diagram showing a configuration of a gate drive device according to the second embodiment of the invention.

As shown in FIG. 6, the precharge control unit 54 in the present embodiment is different from that of the first embodiment (FIG. 1) in that rise delay circuits 48, 49, fall edge pulse circuits 56, 58, and OR circuits 55, 57 are provided. Other circuit configurations are the same as those in the first embodiment (FIG. 1).

Since the signal processing function of the precharge control unit 54 is the same for the upper and lower arms, same as the first embodiment, the signal processing function of the precharge control unit 54 will be described here by taking the upper arm as an example.

The rise delay circuit 48 delays a rise timing of switching the signal SQ3 from Low to High by a predetermined time, and outputs a delay signal to the NOT circuit 44. The rise delay circuit 48 does not delay a fall timing of switching the signal SQ3 from High to Low. The time delayed by the rise delay circuit 48 is set to be equal to or longer than a turn-on switching time of the switching element 13 of the lower arm (drive arm).

The fall edge pulse circuit 56 generates a pulse signal having a predetermined time width when the output of the comparator 40 falls, that is, is switched from High to Low. The fall edge pulse circuit 56 does not generate a pulse signal when the output of the comparator 40 rises, that is, is switched from Low to High. The OR circuit 55 outputs a High signal to the amplifier 32 when either the signal SQ1 or an output of the fall edge pulse circuit 56 is High, and outputs a Low signal to the amplifier 32 when both the signal SQ1 and the output of the fall edge pulse circuit 56 are Low. As a result, in the present embodiment, unlike the first embodiment (FIG. 1), the SQ1' is High for a certain period of time after the output of the comparator 40 is switched from High to Low.

Figure 7:
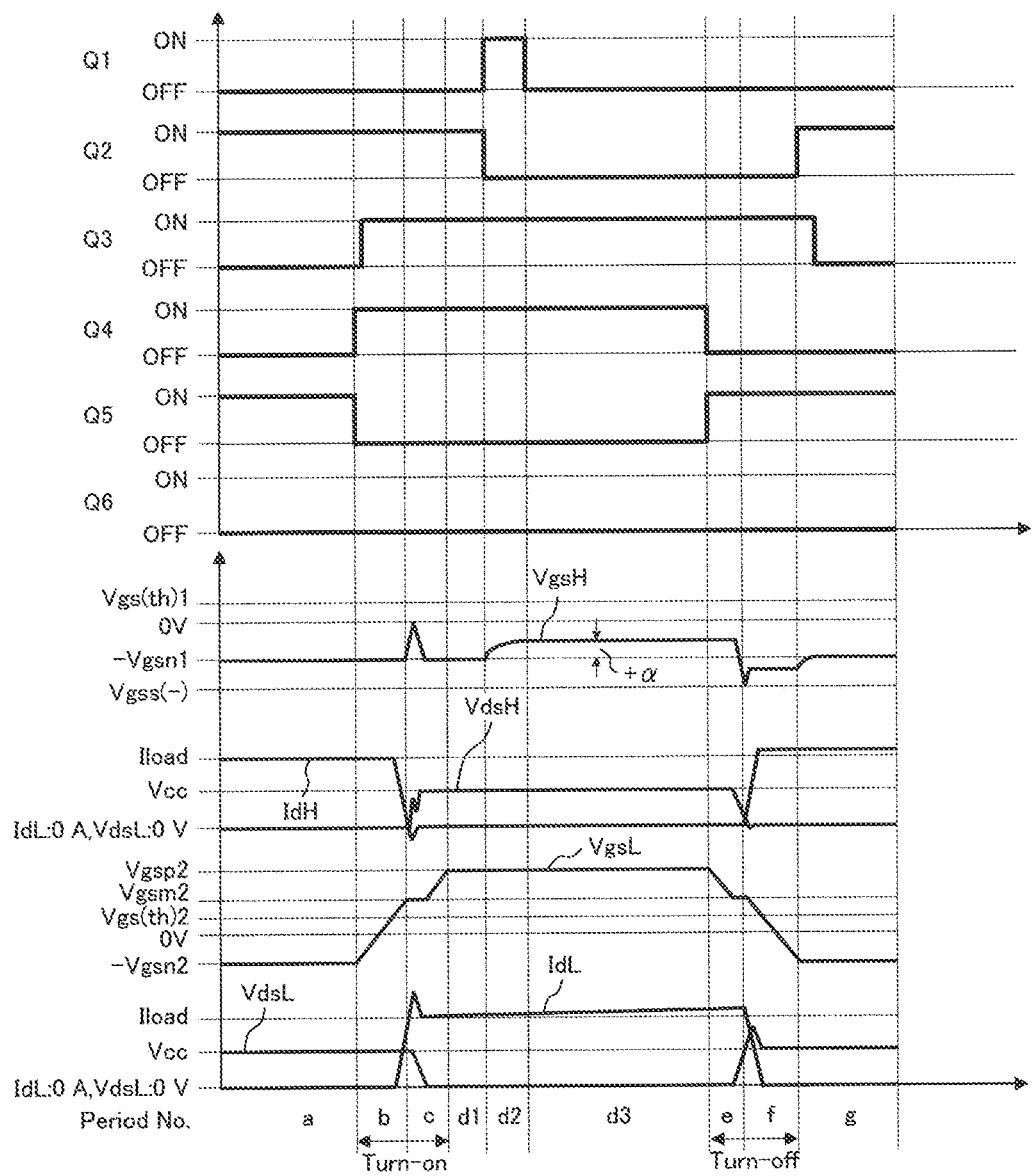
FIG. 7 is a time chart showing an operating state of a gate drive circuit and upper and lower arms in FIG. 6.

FIG. 7 is a time chart showing an operating state of a gate drive circuit and upper and lower arms in FIG. 6.

Same as FIG. 3, FIG. 7 shows, from a top, on and off operating states of the switching elements Q1 to Q6 in the gate drive circuit 51 (FIG. 6), the gate voltage (gate-source voltage) VgsH of the upper arm, a drain voltage (drain-source voltage) VdsH and a drain current IdH of the upper arm, the gate voltage (gate-source voltage) VgsL of the lower arm, and a drain voltage (drain-source voltage) VdsL and a drain current IdL of the lower arm. The IdH in FIG. 7 is a current flowing through the diode 9, and a forward current of the diode 9 is taken as positive.

As shown in FIG. 7, periods a, b, c, d1 to d3, e, f, and g respectively correspond to the periods a, b, c, d, e, f and g shown in FIG. 3.

As the precharge of the VgsH, the charging current flowing through the feedback capacitance is used in the first embodiment described above, but in the present embodiment, a charging current from the DC power supply 20 (positive gate power supply) is used. Therefore, the on state of the Q2 is maintained until the turn-on of the switching element 13 of the lower arm is completed, and the negative gate power supply voltage (−Vgsn1) is continuously applied between the gate and source of the upper arm. Then, during the period d1 in which the turn-on of the switching element 13 is completed and the switching element 13 is in an on state, the Q2 is switched from an on state to an off state, and in the period d2 following the period d1, the Q1 is turned on for a predetermined time (=time of the period d2), so that the positive power supply voltage (Vgsp1) of the gate drive circuit is applied between the gate and source of the switching element 8 of the upper arm. As a result, the VgsH is precharged from −Vgsn1 to −Vgsn1+α.

In the first embodiment described above, a charge amount α from −Vgsn1 in the positive direction depends on the circuit constant and the switching conditions, in other word, is set passively, but in the present embodiment, the charge amount a is set depending on a time of the period d2, that is, an on time width of the Q1. Therefore, in the present embodiment, the magnitude of a can be adjusted by using a pulse width generated by the fall edge pulse circuit 56 (FIG. 6). The magnitude of α is set in the range of −Vgsn1<−Vgsn1+α<0. Therefore, since the VgsH does not exceed the gate threshold voltage Vgs(th)1 of the switching element 8 of the upper arm, the short circuit between the upper and lower arms is prevented.

As described above, according to the present embodiment, the negative gate surge voltage generated in the counter arm is reduced as in the first embodiment. Further, according to the present embodiment, after the turn-on of the drive arm is completed (after the voltage change of the VgsH is completed), the negative gate power supply is disconnected from the counter arm, and the gate-source voltage of the counter arm is precharged by the positive gate power supply, so that magnitude of the precharge voltage can be adjusted.

Third Embodiment

Next, the third embodiment of the invention will be described with reference to FIG. 8.

Figure 8:
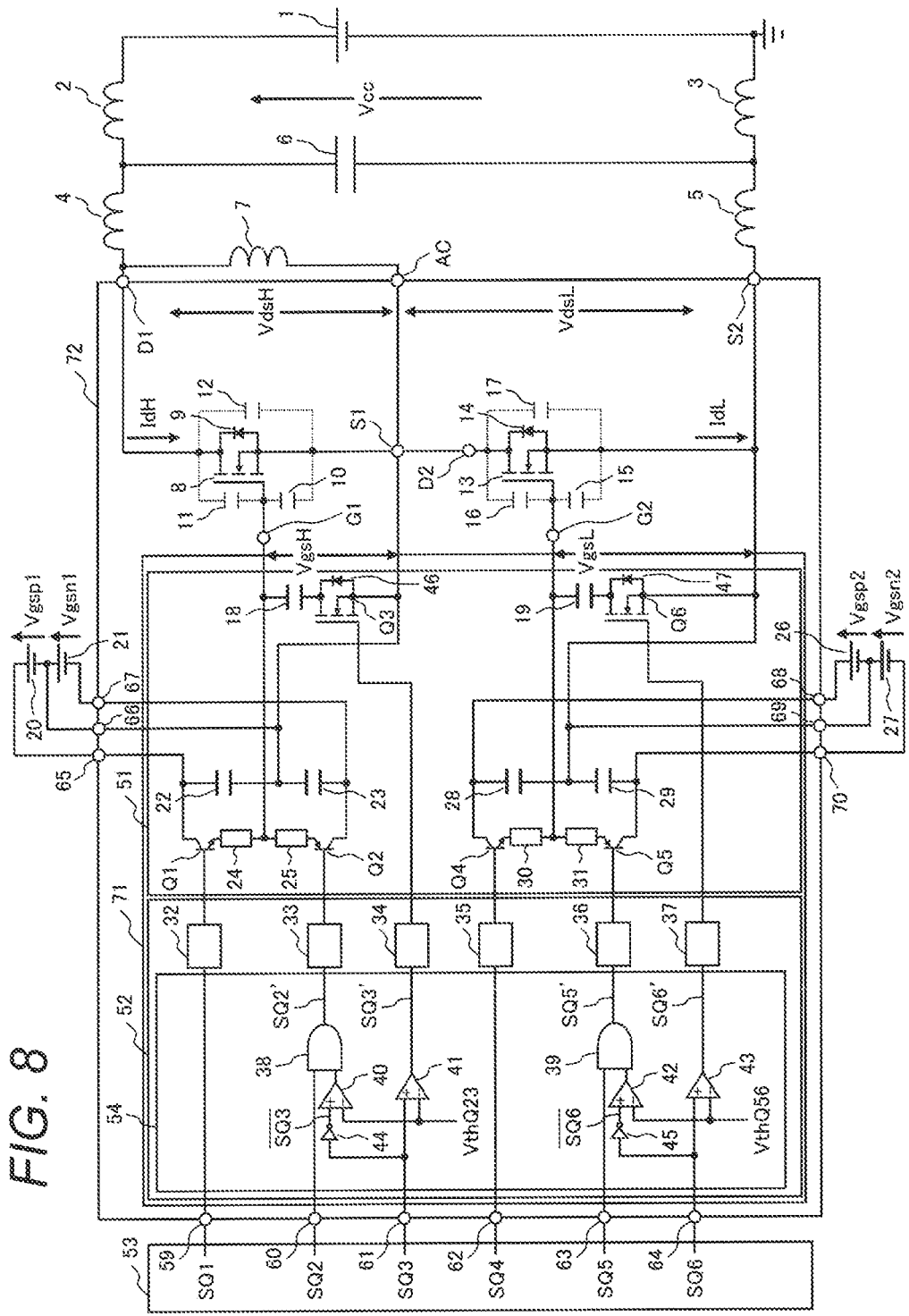
FIG. 8 is a circuit diagram showing a configuration of a gate drive device according to a third embodiment.

FIG. 8 is a circuit diagram showing a configuration of a gate drive device according to the third embodiment of the invention.

As shown in FIG. 8, in the present embodiment, a power semiconductor module 72 houses upper and lower arms and a gate drive device 71 therein. Circuit configurations of the upper and lower arms and the gate drive device 71 are the same as those in the first embodiment (FIG. 1).

The power semiconductor module 72 includes main terminals (D1, AC, S2) as terminals connected to the external circuits, control signal terminals 59 to 64 for inputting the PWM signals (SQ1 to SQ6) from the controller (not shown) of the electric power conversion device, and gate power supply terminals 65 to 70 for supplying power to the gate drive device 71. These terminals are pulled out of a case (not shown) that houses the upper and lower arms and the gate drive device 71.

According to the present embodiment, by housing the gate drive device 71 inside the power semiconductor module 72, wiring impedance between the mirror clamp circuit and the switching elements 8, 13 can be reduced. Thereby, the fluctuation of the gate voltage of the counter arm when the drive arm is switched by the mirror clamp circuit can be prevented.

Fourth Embodiment

Next, the fourth embodiment of the invention will be described with reference to FIG. 9.

Figure 9:
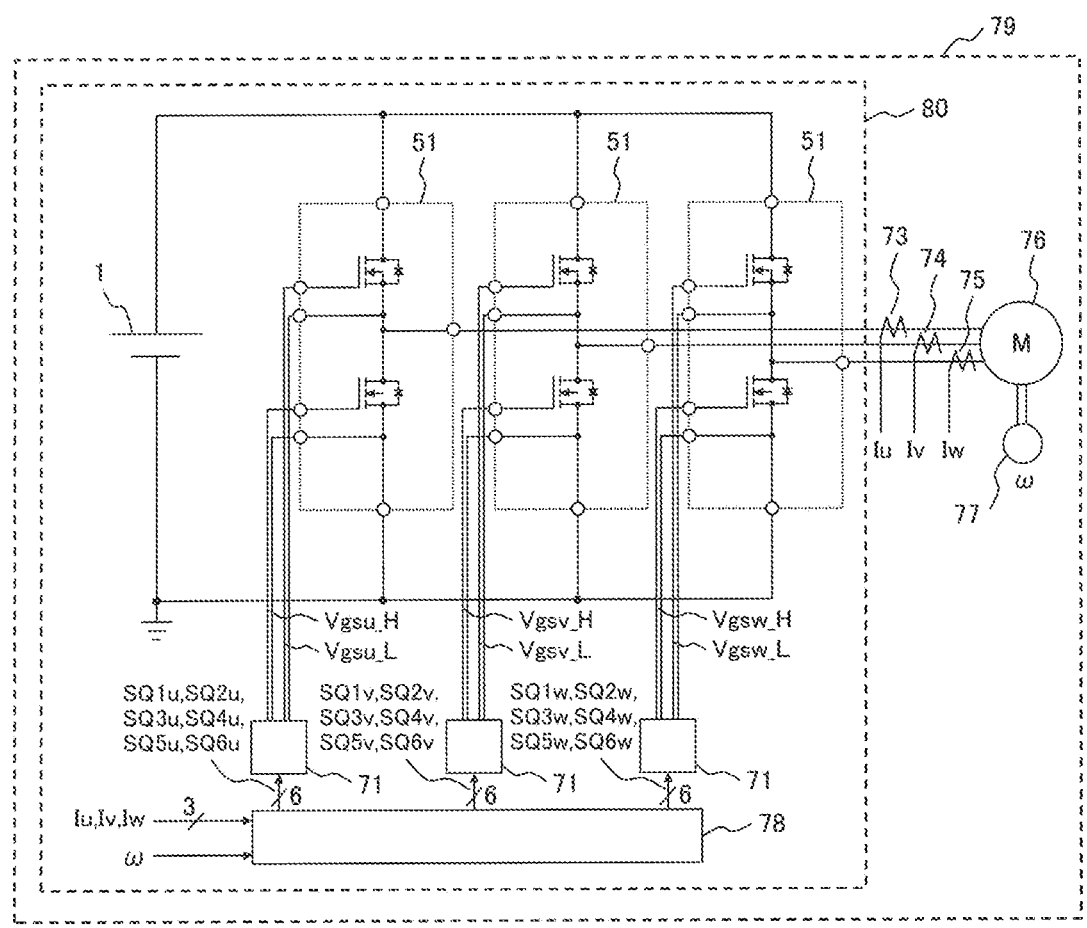
FIG. 9 is a configuration diagram of a motor drive system according to a fourth embodiment.

FIG. 9 is a configuration diagram of a motor drive system according to the fourth embodiment of the invention.

As shown in FIG. 9, in a motor drive system 79, a motor 76 is driven by an AC power output from an electric power conversion device 80. The electric power conversion device 80 includes a three-phase inverter main circuit including three power semiconductor modules 51 (2in1 modules) each module including a set of upper and lower arms, the DC power supply 1 connected to a DC side of the three-phase inverter main circuit, the gate drive devices 71 configured to drive the power semiconductor modules 51, and a controller 78 configured to output the PWM signal to the gate drive device 71. As the gate drive device 71, any one of the gate drive devices according to the first embodiment and the second embodiment described above is applied. The motor 76 is a three-phase AC motor, and each phase of the motor 76 is connected to an output terminal ("AC" in FIG. 1) of the power semiconductor module.

The controller 78 calculates 6 PWM signals (SQ1$i$ to SQ6$i$, $i$=u, v, w) for each phase based on a three-phase current (Iu, Iv, Iw) of the motor 76 detected by a current sensor (73, 74, 75) and a rotational speed ($\omega$) of the motor 76 detected by a speed detector 77, and outputs the calculated signal to the gate drive device 71 of each phase. The power semiconductor module 51 is switched by the gate drive device 71 in response to the PWM signal, so that DC power from the DC power supply 1 is converted into three-phase AC power. The motor 76 is driven by this three-phase AC power.

By applying, as the gate drive device 71, any of the gate drive devices according to the first embodiment and the second embodiment described above, the negative gate surge voltage generated in the counter arm when the drive arm is turned off in the upper and lower arms can be reduced. Therefore, reliability of the electric power conversion device 80 and the motor drive system 79 is improved.

By applying the third embodiment described above and housing the gate drive device 71 in the power semiconductor module 51, the fluctuation of the gate voltage in the counter arm can be prevented. Therefore, the reliability of the electric power conversion device 80 and the motor drive system 79 is improved.

The invention is not limited to the embodiments described above, and includes various modifications. For example, the embodiments described above have been described in detail for easy understanding of the invention, and the invention is not necessarily limited to those including all the configurations described above. Apart of a configuration of one embodiment can be replaced with a configuration of another embodiment, and a configuration of another embodiment can be added to a configuration of one embodiment. Further, a part of the configuration of each embodiment may be added, deleted, or replaced with another configuration.

The invention can also be applied when a conductive type of a channel of an insulated gate type switching element in the arm is different from the above-described embodiment. In this case, positive and negative of the gate power supply voltage and the gate threshold voltage are opposite to those in the above-described embodiment.

What is claimed is:

1. A gate drive device that drives a semiconductor device constituting an arm in an electric power conversion device, wherein
    before a turn-off start of a drive arm, in a counter arm, a voltage between one main terminal of the semiconductor device and a gate terminal of the semiconductor device is charged to a voltage value that is larger, in a positive direction, than a negative voltage of a negative gate power supply and smaller than a gate threshold voltage of the semiconductor device; and
    a series-connected circuit that includes a switching element and a capacitor and that is connected between the one main terminal and the gate terminal is included.

2. The gate drive device according to claim 1, wherein the voltage value is less than zero.

3. The gate drive device according to claim 1, wherein during a period between a turn-on start and a turn-on completion of the drive arm, in the counter arm, the switching element is in an on state, and the negative gate power supply is electrically disconnected from the semiconductor device.

4. The gate drive device according to claim 3, wherein after a turn-off completion of the drive arm, in the counter arm, the negative voltage is applied between the one main terminal and the gate terminal, and then the switching element is turned off.

5. The gate drive device according to claim 1, wherein during a period between a turn-on start and a turn-on completion of the drive arm, in the counter arm, the switching element is in an on state and the negative voltage is applied between the one main terminal and the gate terminal, and
    after the turn-on completion of the drive arm, in the counter arm, the negative gate power supply is electrically disconnected from the semiconductor device, and a positive gate power supply is connected between the one main terminal and the gate terminal for a predetermined time to apply a positive voltage.

6. The gate drive device according to claim 5, wherein after a turn-off completion of the drive arm, in the counter arm, the negative voltage is applied between the one main terminal and the gate terminal, and then the switching element is turned off.

7. A gate drive method comprising:
driving a semiconductor device constituting an arm in an electric power conversion device, wherein
before a turn-off start of a drive arm, in a counter arm, a voltage between one main terminal of the semiconductor device and a gate terminal of the semiconductor device is charged to a voltage value that is larger, in a positive direction, than a voltage of a negative gate power supply and smaller than a gate threshold voltage of the semiconductor device; and
a series-connected circuit that includes a switching element and a capacitor and that is connected between the one main terminal and the gate terminal is included.

8. A power semiconductor module comprising:
an upper arm and a lower arm constituting a main circuit of an electric power conversion device;
a first gate drive device configured to drive the upper arm; and
a second gate drive device configured to drive the lower arm, wherein
the first gate drive device, before a turn-off start of the lower arm, charges a voltage between one main terminal of a first semiconductor device constituting the upper arm and a gate terminal of the first semiconductor device to a voltage value that is larger, in a positive direction, than a negative voltage of a first negative gate power supply and smaller than a gate threshold voltage of the first semiconductor device, and
the second gate drive device, before a turn-off start of the upper arm, charges a voltage between one main terminal of a second semiconductor device constituting the lower arm and a gate terminal of the second semiconductor device to a voltage value that is larger, in a positive direction, than a negative voltage of a second negative gate power supply and smaller than a gate threshold voltage of the second semiconductor device.

9. An electric power conversion device comprising:
a main circuit including a plurality of pairs of arms;
a first gate drive device configured to drive an upper arm in the pair of arms; and
a second gate drive device configured to drive a lower arm in the pair of arms, wherein
the first gate drive device, before a turn-off start of the lower arm, charges a voltage between one main terminal of a first semiconductor device constituting the upper arm and a gate terminal of the first semiconductor device to a voltage that is larger, in a positive direction, than a negative voltage of a first negative gate power supply and smaller than a gate threshold voltage of the first semiconductor device, and
the second gate drive device, before a turn-off start of the upper arm, charges a voltage between one main terminal of a second semiconductor device constituting the lower arm and a gate terminal of the second semiconductor device to a voltage that is larger, in a positive direction, than a negative voltage of a second negative gate power supply and smaller than a gate threshold voltage of the second semiconductor device.

* * * * *